(12) United States Patent
Ma

(10) Patent No.: US 7,911,245 B2
(45) Date of Patent: Mar. 22, 2011

(54) MULTI-PHASE SIGNAL GENERATOR AND METHOD

(75) Inventor: Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 84 days.

(21) Appl. No.: 12/245,407

(22) Filed: Oct. 3, 2008

(65) Prior Publication Data

US 2010/0085094 A1 Apr. 8, 2010

(51) Int. Cl.
*H03L 7/00* (2006.01)
(52) U.S. Cl. ......... 327/145; 327/144; 327/155; 327/158
(58) Field of Classification Search .................. 327/141, 327/144–163; 331/1 A, 15–17; 375/373–376
See application file for complete search history.

(56) References Cited

U.S. PATENT DOCUMENTS

| 6,304,116 B1 * | 10/2001 | Yoon et al. ..................... 327/158 |
| 7,084,686 B2 | 8/2006 | Zimlich ......................... 327/291 |
| 7,106,655 B2 | 9/2006 | Lee .............................. 365/233 |
| 7,426,145 B2 | 9/2008 | Lee et al. ..................... 365/189.05 |
| 2008/0252340 A1 * | 10/2008 | Yeo et al. ..................... 327/156 |
| 2010/0085099 A1 | 4/2010 | Ma ............................... 327/295 |
| 2010/0103746 A1 | 4/2010 | Ma ............................ 365/189.05 |

OTHER PUBLICATIONS

Ki-Won Lee et al.; "*A 1.5-V 3.2 Gb/s/pin Graphic DDR4 SDRAM With Dual-Clock System, Four-Phase Input Strobing, and Low-Jitter Fully Analog DLL*"; IEEE Journal of Solid-State Circuits, vol. 42; No. 11; Nov. 2007; pp. 2369-2377.

* cited by examiner

*Primary Examiner* — Lincoln Donovan
*Assistant Examiner* — Brandon S Cole
(74) *Attorney, Agent, or Firm* — Dorsey & Whitney LLP

(57) ABSTRACT

A multi-phase signal generators and methods for generating multi-phase signals are described. In one embodiment, a clock generator generates quadrature signals including those having 90, 180, 270 and 360 degrees phase difference with a first signal. The rising edge of an intermediate signal is compared with the rising edges of two of the other signals to generate an UP and DN pulse signal, respectively. The UP and DN signals are used to adjust the delay of a delay line producing the signals to synchronize the signals. In some embodiments, a reset signal generator is used to truncate the UP or DN signal pulse.

29 Claims, 7 Drawing Sheets

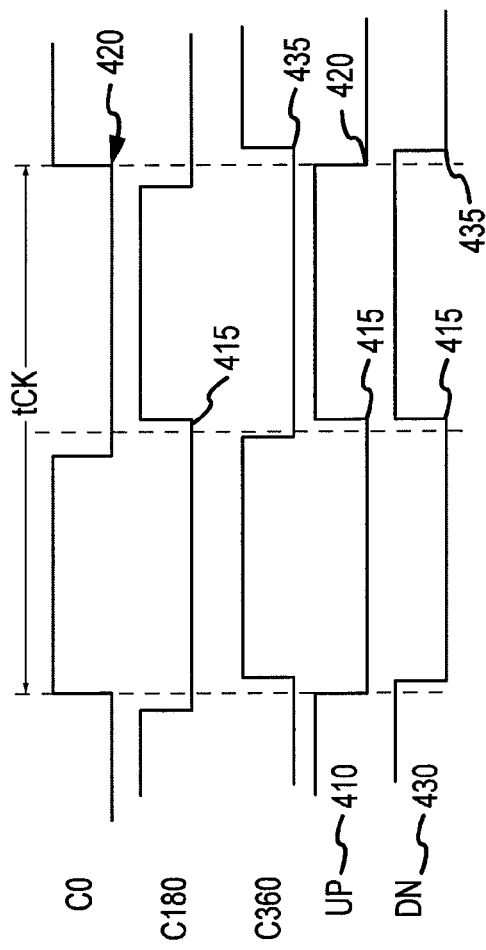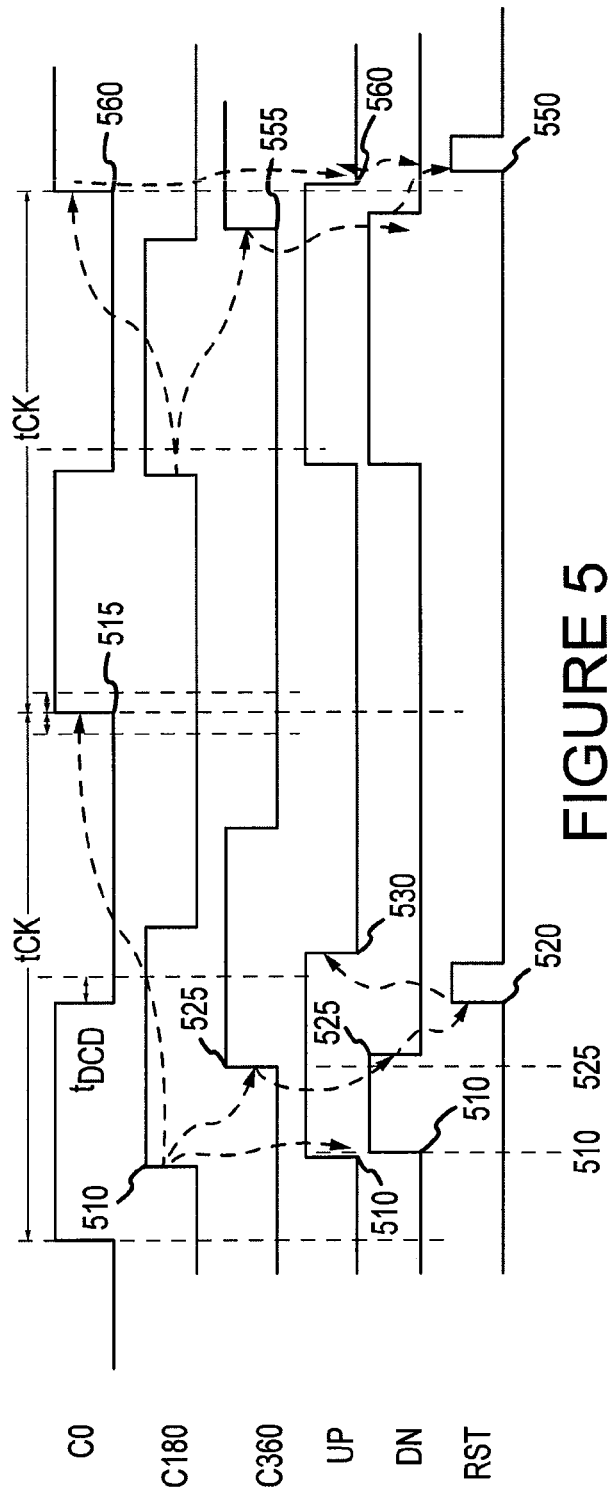

MULTI-PHASE SIGNAL GENERATOR AND METHOD

TECHNICAL FIELD

Embodiments of the invention relate generally to signal generating systems, and more particularly, in one or more embodiments to methods and systems for fast initializing a multi-phase clock signal generator.

BACKGROUND OF THE INVENTION

Periodic signals are used in a variety of electronic devices. One type of periodic signals are clock signal s that can be used to establish the timing of a signal or the timing at which an operation is performed on a signal. For example, data signals are typically coupled to and from memory devices, such as synchronous dynamic random access memory ("SDRAM") devices, in synchronism with a clock or data strobe signal. More specifically, read data signals are typically coupled from a memory device in synchronism with a read data strobe signal. The read data strobe signal typically has the same phase as the read data signals, and it is normally generated by the same memory device that is outputting the read data signals. Write data signals are typically latched into a memory device in synchronism with a write data strobe signal. The write data strobe signal should have a phase that is the quadrature (having a phase 90-degrees relative to the phase) of the write data signals so that a transition of the write data strobe signal occurs during a "data eye" occurring at the center of the period in which the write data signals are valid.

Internal clock signals generated in electronic devices, for example, memory devices or memory controllers, are often synchronized or have some other controlled phase relationships relative to external or internal clock signals. For example, with reference to a memory device, a quadrature clock signal used for both latching write data and outputting read data may be generated in the memory device to which the data are being written. The quadrature clock signal is typically generated in the memory device from an internal clock signal that is also derived from the system clock signal.

Internal clock signal s having synchronized or some other controlled phase relationships with external and internal clock signals may also be used for applications other than for use as a write data strobe signal. For example, a "frequency doubler" circuit, which generates an output clock signal having twice the frequency of an input clock signal, can be implemented using an appropriate logic circuit that receives the input clock signal and quadrature versions of the input clock signal. Internal clock signal s may also be generated having other than a quadrature phase relationships. Generally, any phase relationship between output clock signals can be used.

Various techniques can be used to generate a quadrature clock signals or read/write data strobe signal. If the frequency of the internal clock signal is fixed, quadrature clock signals can be generated by a timing circuit that simply generates a transition of the quadrature clock signals a fixed time after a corresponding transition of the internal clock signal. However, synchronous memory devices are typically designed and sold to be operated over a wide range of clock frequencies. Therefore, it is generally not practical to use a fixed timing circuit to generate quadrature signals from the internal clock signal. Instead, a circuit that can adapt itself to an internal clock signal having a range of frequencies must be used.

An example of such a circuit is a multi-phase clock signal generator. A multi-phase clock signal generator, as known, generates multi-phase clock signals to provide several clock signals having fixed phase relationships to a reference clock signal, such as an external or internal clock signal. In operation, a multi-phase clock signal generator should be initialized to ensure the generated clock signals have the correct phase relationship. A conventional method of initializing a multi-phase clock signal generator will now be described with reference to FIG. 1. The conventional multi-phase clock signal generator 100 includes a delay line 105 having a plurality of delay elements 110a-d coupled in series with each other. Each of the delay elements 110a-d has two inputs, two outputs, and a control input (not shown). Each delay element 110a-d has two inputs and two outputs to provide for a double-ended configuration where both a clock signal 120 and its complement 121 are received and processed. A single-ended configuration may also be used.

Each of the delay elements 110a-d couples a signal from its input to its output with a delay corresponding to a delay control signal applied to its control input. The input of the initial delay element 110a receives a clock signal 120 and its complement 121. The outputs of all but the last delay element 110d is coupled to the input of the subsequent delay element. The output of each delay element 110a-d forms a respective tap of the delay line 105 to provide four clock signals C90, C180, C270, and C360, respectively C360 is a one clock delayed version of C0 at lock status. As indicated by their names, the C90 signal has a 90 degree phase difference with the input clock signal 120. The C180 signal has a 180 degree phase difference with the input clock signal 120, the C270 signal a 270 degree phase difference, and the C360 signal a 360 degree phase difference. As explained in greater detail below, the amount of voltage-controlled delay provided by each of the delay elements 110a-d sets a minimum and maximum amount of delay that can be achieved by the delay line 105.

To ensure the proper phase relationships are maintained between the four provided clock signals, a two-step locking phase detector 130 receives the input clock signal 120, the C180 signal and the C360 signal. The phase detector 130 will first lock the C180 signal to the C0 signal, and then in the second step, lock the C360 signal with the C0 signal. To lock the C0 and C180 signal, the phase detector 130 produces an error signal corresponding to a mismatch between the falling edge of the C180 signal and the rising edge of the C0 signal. The error signal is used to adjust the delay of the delay elements 110a-d such that the C0 and C180 signals are 180 degrees apart. As shown in FIG. 1, the error signal is converted to a control signal by a charge-pump and loop filter 140. The control signal is used by a bias voltage generator 150 to couple a $V_{BIAS}$ signal to the control inputs of the delay elements 110a-d. Once the rising edge of the C0 and the falling edge of the C180 signals are synchronized, in the second step of operation of the phase detector 130, an error signal is generated corresponding to a mismatch between a rising edge of the C0 signal and a rising edge of the C360 signal. In a similar manner, the error signal is used to adjust the delay of the delay elements 110a-d. This two-step locking process may be sufficient in some cases where the duty cycle of the signal is at or near 50 percent or slow locking time is not an issue. However, difficulties occur when the incoming clock signal contains some duty cycle distortion, as will now be explained with reference to FIG. 2.

FIG. 2 is a timing diagram illustrating signals from FIG. 1. A clock period is shown in FIG. 2 as $t_{CK}$, between $t_0$ and $t_2$. The incoming clock signal, C0 has an amount of duty cycle distortion shown by $t_{DCD}$. That is, in the case where the C0 signal had an ideal, 50 percent duty cycle, the high pulse would extend from time $t_0$ to time $t_1$ in FIG. 2. However, as shown, the C0 high pulse is significantly shorter. The phase detector 130 then locks the falling edge of the C180 signal with the rising edge of the C0 signal at time $t_2$, as shown by arrow 210. The phase detector 130 will lock the signals within a tolerance, shown by $\pm t_{PDmin}$ in FIG. 2. Due to the duty cycle distortion, the rising edge of the C180 signal is $t_{x1}$ off from time $t_1$, where the signal should be for a 180 degree phase difference. Accordingly, the C180 signal has been delayed $t_{x1}$ too much. Recall that adjusting the control voltage applied to the delay elements 105 of FIG. 1 adjusts the delay of all the delay elements 110a-d. The C360 signal will now be $2*t_{x1}$ off from locked with C0, as shown in FIG. 2. The second step of operation of the phase detector 130 will be to adjust the delay of the delay elements 110a-d such that the C360 signal is synchronized with the C0 signal, by matching the rising edge of the C0 signal with the rising edge of the C360 signal, as shown in the second timing diagram of FIG. 2 by the arrow 220.

Duty cycle distortion in incoming clock signals is not uncommon, and, taking signal jitter into consideration, could be a significant portion of reference clock period. With duty cycle distortion, the two-step locking phase detector 130 may cease to function properly. The delay line 105 may have insufficient range to accommodate the lengthy $t_{x1}$ and $2*t_{x1}$ delay times that should be compensated for according to FIG. 2. One solution to this problem is to place a duty-cycle control element prior to and in series with the multi-phase clock signal generator 100. This may ensure the multi-phase clock signal generator receives a clock signal with a correct duty cycle. However, a duty cycle control element also has a limited working range and takes much longer time to achieve corrected output signals. Accordingly, this solution may also become impractical as speeds increase and timing requirements tighten.

There is accordingly a need for an improved system and method for providing multi-phase clock signals.

BRIEF DESCRIPTION OF THE DRAWINGS

FIG. 4 is a timing diagram illustrating the operation of the signal generator of FIG. 3.

FIG. 5 is a timing diagram illustrating the operation of another embodiment of the signal generator of FIG. 3.

DETAILED DESCRIPTION

Certain details are set forth below to provide a sufficient understanding of embodiments of the invention. However, it will be clear to one skilled in the art that embodiments of the invention may be practiced without various of these particular details. In some instances, well-known circuits, control signals, timing protocols, and software operations have not been shown in detail in order to avoid unnecessarily obscuring the described embodiments of the invention.

Figure 3:
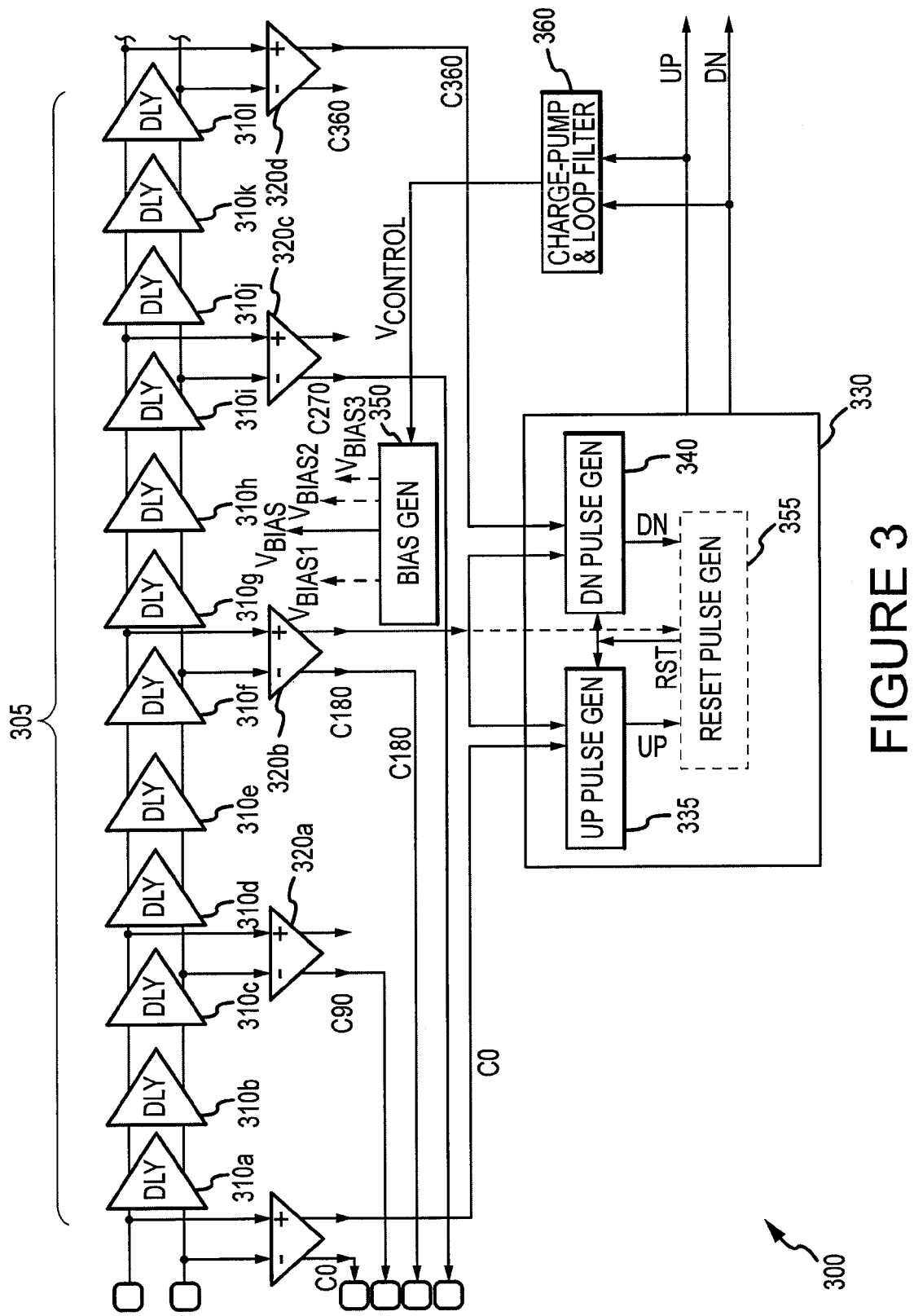
FIG. 3 is a schematic diagram of a multi-phase clock signal generator according to an embodiment of the present invention.

An embodiment of a multi-phase clock signal generator 300 according to an embodiment of the present invention is shown schematically in FIG. 3. While one delay element per tap may be used in some embodiments of the present invention, as was described above with reference to FIG. 1, the delay line 305 of FIG. 3 includes twelve delay elements 310a-l. Three delay elements are provided for each tap 320a-d. Using multiple delay elements per tap may allow greater flexibility in the range of delay that can be provided by the delay line 305. For example, the bias generator 350 may produce one bias voltage, $V_{BIAS}$, that adjusts each of the delay elements 310a-l the same amount. However, in some embodiments, the bias generator 350 may produce several bias voltages, shown as $V_{BIAS1}$, $V_{BIAS2}$, and $V_{BIAS3}$ in FIG. 3. Each bias voltage may adjust a different set of delay elements 310a-l. For example, delay elements 310a, d, g, and j may be controlled by $V_{BIAS1}$ and have a large range to provide course control of the delay of the delay line 305. Delay elements 310b, e, h, and k may be controlled by $V_{BIAS2}$ and have a medium range to provide medium range control of the delay of the delay line 305. Delay elements 310c, f, i, and l may be controlled by $V_{BIAS3}$ and may have a small range to provide fine control of the delay of the delay line 305. In this manner, a larger range of delay with adaptive wide range and timing delay resolution may be achieved.

Although four taps 320a-d are shown in FIG. 3 to provide quadrature clock signals, any number of signals may be generated according to embodiments of the present invention having any phase relationship with the incoming signal, C0. Similarly, although three delay elements are shown in the delay line 305 for each tap 320a-d, any number of delay elements may be used for each tap, including more than three delay elements and less than three delay elements.

Figure 1:
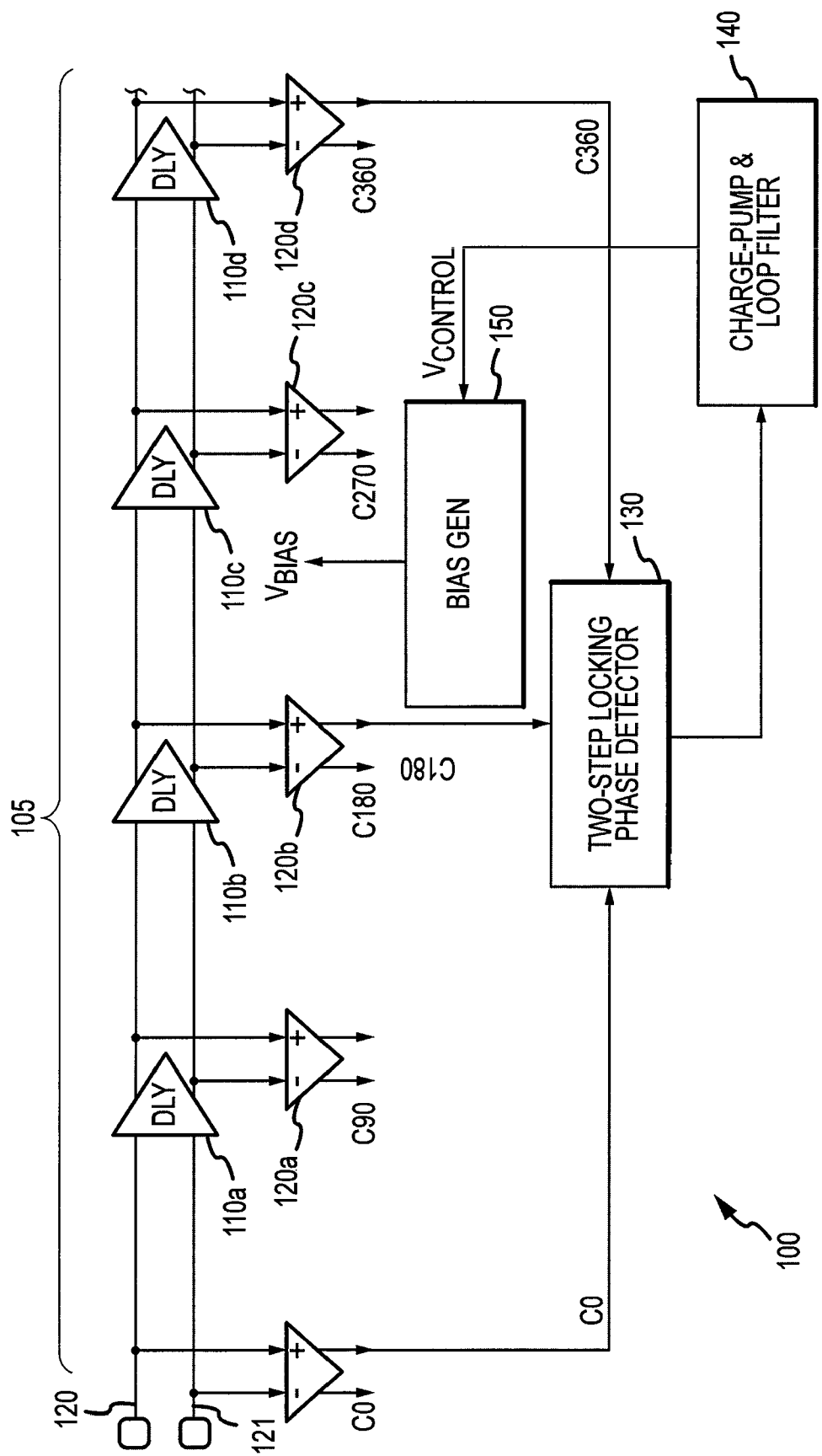
FIG. 1 is a schematic diagram of a multi-phase clock signal generator according to the prior art.
Figure 2:
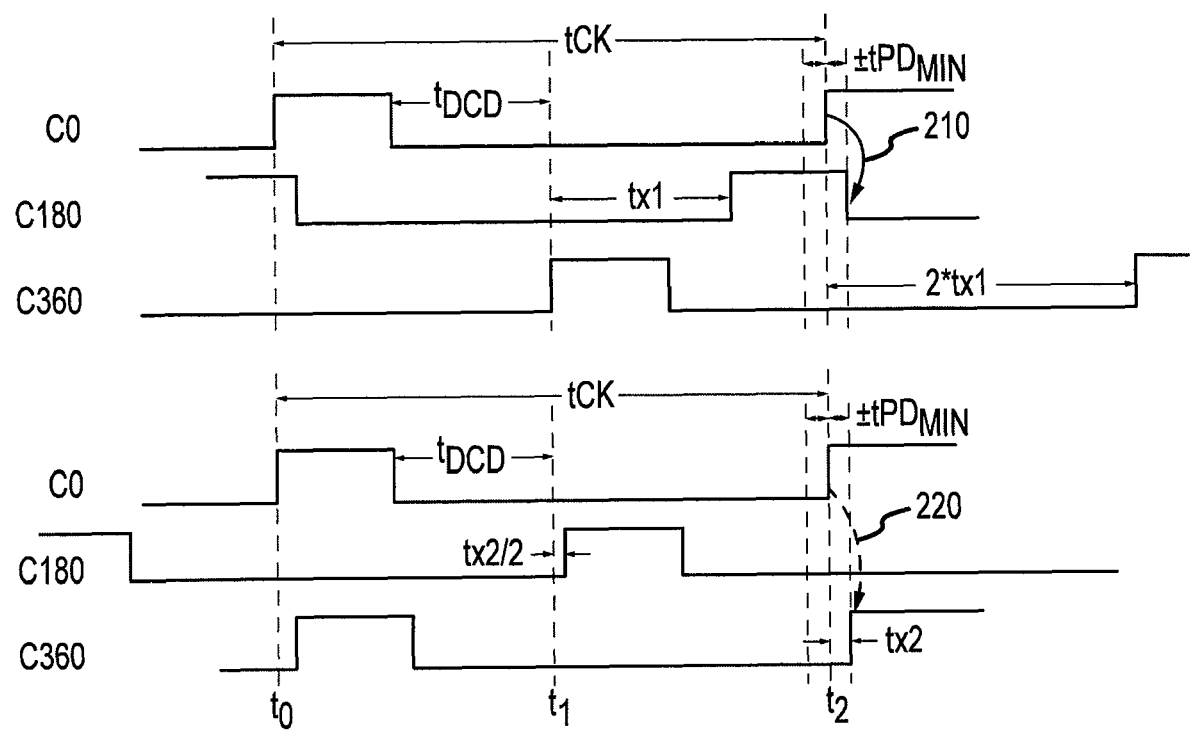
FIG. 2 is a timing diagram illustrating the operation of the clock signal generator of FIG. 1.

The phase detector 330 of FIG. 3 is configured to provide an adjustment signal to lock the C0, C180 and C360 signals in a single adjustment, in contrast to the two-step process performed by the phase detector 130 of FIG. 1. The operation of the phase detector 330 will now be discussed with reference to the timing diagram of FIG. 4.

The phase detector 330 includes a first pulse generator 335 (labeled 'UP Pulse Gen' in FIG. 3) and a second pulse generator 340 (labeled 'DN Pulse Gen' in FIG. 3). The first pulse generator 335 generates the UP signal 410 shown in FIG. 4. The UP signal is high from the rising edge of the C180 signal until the rising edge of the C0 signal, times 415 and 420, respectively, in FIG. 4. The second pulse generator 340 generates the DN signal 430 shown in FIG. 4. The DN signal is high from the rising edge of the C180 signal until the rising edge of the C360 signal, times 415 and 435, respectively in FIG. 4. As is described further below, the UP and DN signals are coupled to the charge-pump and loop filter 360 and are used to configure delay of the delay line 305 by adjusting the delay of one or more of the delay elements 310a-l such that the UP and DN signals are equal, indicating the C0, C180, and C360 signals are in synch with one another.

In this manner, once the C0, C180, and C360 signals are synchronized, the UP and DN signals will be equal and will each have a 50 percent duty cycle, because the signals will rise at the rising edge of C180, which will occur at one-half the clock period, $t_{CK}$, in FIG. 4, and will fall at the rising edge of C0 and C360, respectively, which will occur at the end of the clock cycle. Accordingly, the phase detector 330 in FIG. 3 itself generates a 50 percent duty cycle signal at the clock frequency $t_{CK}$. The UP and DN signals may accordingly themselves be used as clock signals in some embodiments.

Operation of an embodiment of the phase detector 330 has been described above with reference to the timing diagram of FIG. 4. However, the embodiment described above utilizes UP and DN signals which contain pulses truncated (e.g. terminating) at a rising edge of the C0 and C360 signals, respectively. Waiting for the next rising edge of the C0 and C360 signals to truncate the pulse of the UP and DN signals, respectively, may interfere with phase comparison measurements in a next clock cycle in some embodiments. For example, as the clock frequency increases, if the UP or DN signal is too long initially it may interfere with accurate phase measurements during a next clock cycle. Also, it takes a finite amount of adjustment time to adjust a delay of the delay line 305 responsive to the UP and DN signals. Receipt and comparison of the UP and DN signals takes time, the charge pump and loop filter 350 takes time to react, as does the bias generator 350. Further time elapses as the delay of the delay line 305 is changed. If the clock period, $t_{CK}$, is short in compared to the time for the adjustment to occur, generally, less than about two times the adjustment time, then the adjustment made by the charge-pump and loop filter 350 may not be visible by the phase detector 330 in the next comparison. Accordingly, it may be advantageous to make smaller adjustments to the delay of the delay line 305 to minimize any over- or under-shoot that may occur and not be observed until later clock cycles, at which point even further adjustments would have been made.

Accordingly, in some embodiments, a reset pulse generator 355 is coupled to the first and second pulse generators 335 and 340. The reset pulse generator 355 receives the UP and DN signals generated by the first and second pulse generators 335 and 340. The reset pulse generator 355 couples a reset signal, labeled Rst in FIG. 4, to the first and second pulse generators 355 and 340. Operation of an embodiment of the phase detector 330 including the reset pulse generator 355 will now be described with reference to the timing diagram of FIG. 5.

As shown in FIG. 5, the delay of the delay line 305 is too short such that the C180 signal rises at time 510, less than a quarter clock period after the C0 signal. Recall pulses of the UP and DN signals both begin at the rising edge of the C180 signal, time 510 in FIG. 5. Because of the insufficient delay between the C0 and C180 signals, in the embodiment shown in FIG. 5, the time between the rising edge of the C180 signal and the next rising edge of the C0 signal, time 515 in FIG. 5, is over three-quarters of a clock period. In the example above, the UP signal would contain a pulse having a width from the rising edge of the C180 signal to the next rising edge of the C0 signal. However, in the embodiment of FIG. 5, the reset pulse generator 355 is used to reduce the length of the UP pulse. The reset pulse generator 355 receives the rising edge of the UP and DN signals, or in some embodiments, receives the rising edge of the C180 signal. Following receipt of the rising edge of the C180 signal, the reset pulse generator 355 generates a reset pulse a delay time following the receipt of the next occurring rising edge—either the C0 or C360 signals. The reset pulse generator 355 may receive the C0 and C360 signals itself, or may detect the first rising edge by receipt of the falling edge of the UP or DN signal. With reference to FIG. 5, the rising edge of the C360 signal occurs first, at time 525, after the rising edge of the C180 signal, as indicated by the falling edge of the DN signal. Accordingly, reset pulse generator 355 generates a pulse at time 520, a delay time after receipt of the rising edge of the C360 signal. The reset signal is coupled to the UP pulse generator 335 and causes the UP pulse generator 335 to truncate the pulse at time 530. The DN and truncated UP signals are coupled to the charge pump and loop filter 360 and used to adjust the delay of the delay line 305. In this manner, the speed of the locking may be improved relative to the embodiment described above that did not employ a reset pulse generator 355.

In the second clock period, beginning at time 515 in FIG. 5, the delay of the delay line 305 has been changed in accordance with the UP and DN signals such that the C0 and C360 signals are closer to synchronization. The reset pulse generator 355 generates a pulse at time 550, a delay time after the rising edge of the C360 signal at time 555. However, the pulse at time 550 does not cause the UP pulse generator 335 to truncate the UP pulse because the UP pulse had already fallen at time 560 responsive the rising edge of the C0 signal. Accordingly, the reset pulse generator 355 causes either the first or second pulse generators 335 and 340 to truncate a generated pulse when the C0 and C360 signals are out of synchronization by greater than a threshold amount. When the C0 and C360 signals are closer together than the threshold amount, the reset pulse does not affect operation of the first and second pulse generators 335 and 340. As discussed above, and will be discussed further below, the charge-pump and loop filter 360 is configured to output a control signal responsive to the UP and DN signals to adjust the delay of the delay line 305 to minimize a difference between the UP and DN signals such that when the C0 and C360 signals are in synchronization, the UP and DN signals are equal and each have a 50 percent duty cycle. In some embodiments, the UP and DN signals themselves may be used as clock signals.

Note that, when the pulse widths of the UP and DN signals are equivalent, the C0 and C360 signals are locked, that is, the phase difference between the C0 and C360 signals is zero. Accordingly, the charge-pump and loop filter 360 are configured to configure the delay based on a difference of pulse widths between the UP and DN signals to minimize the phase difference between the C0 and C360 signals. For example, the $V_{CONTROL}$ signal may indicate to the bias generator 350 to increase the delay of the delay line 305 during a period when the UP signal is high and the DN signal low. The $V_{CONTROL}$ signal may indicate to the bias generator 350 to decrease the delay of the delay line 305 during a period when the UP signal is low and the DN signal high. The $V_{CONTROL}$ signal may indicate to the bias generator 350 to maintain the delay of the delay line 305 when the UP and DN signals have the same level. The charge-pump and loop filter 360 may be implemented in any of a variety of ways. For example, in one embodiment the loop filter may be implemented as a capacitor. The charge pump may include a current source which charges the capacitor responsive to the UP signal being high while the DN signal is low. The charge pump may further include a current sink which discharges the capacitor responsive to the UP signal being low while the DN signal is high. The charge pump would not effect the capacitor when the UP and DN signals had the same state. In this manner, the capacitor builds a voltage which may be, or be used to generate, the $V_{CONTROL}$ signal.

Figure 6:
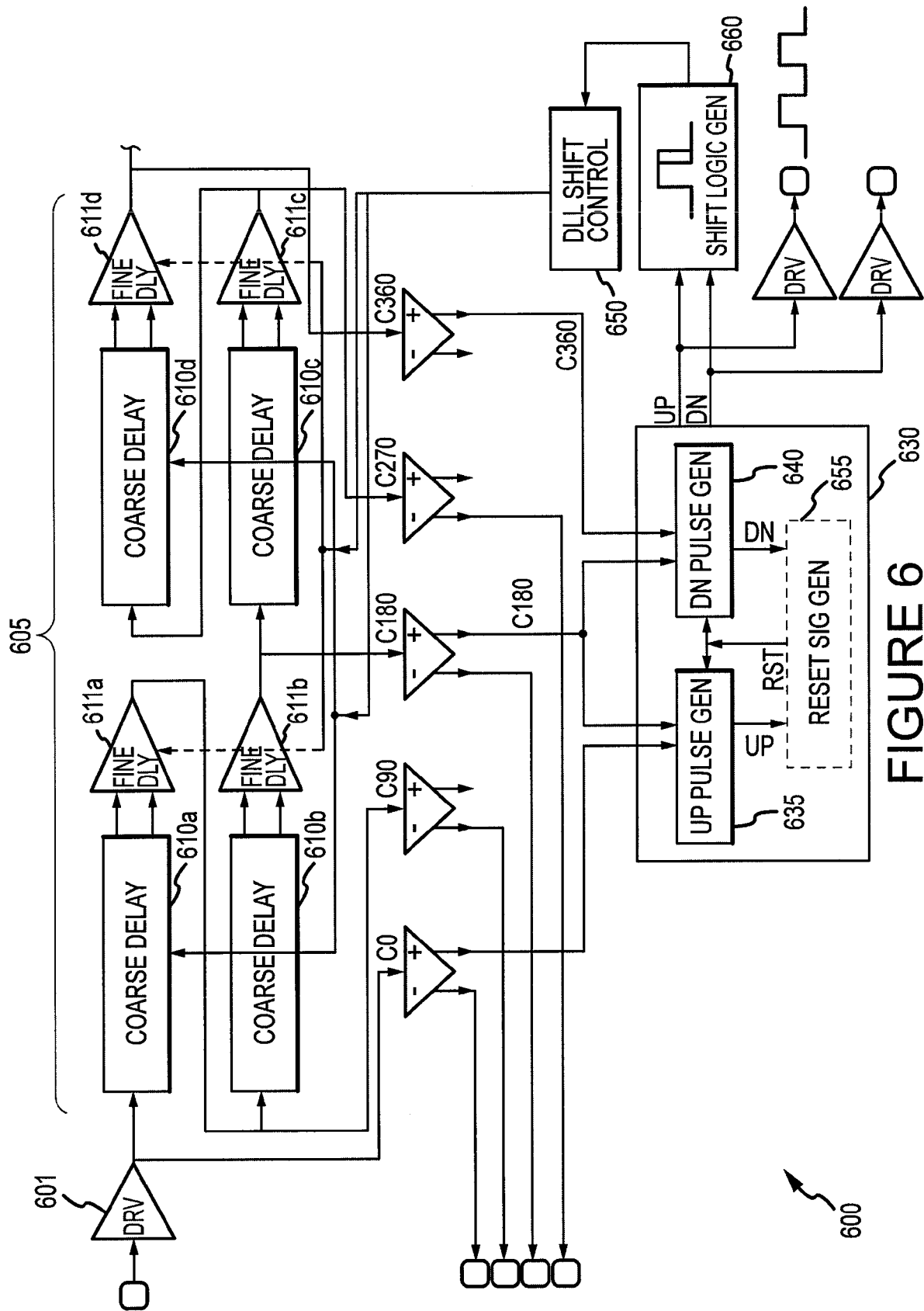
FIG. 6 is a schematic diagram of a multi-phase clock signal generator according to an embodiment of the present invention.

The embodiments described above employed an analog implementation of a multi-phase generator 300. However, a digital implementation may also be used, as shown as the digital multi-phase generator 600 in FIG. 6. In the embodiment of FIG. 6, an input clock signal is received by a driver 601 and coupled to a delay line 605. The delay line 605 includes digital coarse delay elements 610a-d and digital fine delay elements 611 a-d. As discussed with the delay elements 310a-l above, and number of coarse and fine delay elements may be used. While in some embodiments delay elements having different ranges (such as coarse and fine) are used, in other embodiments, all delay elements have a same range.

Further, in some embodiments, delay elements may be used having more than two different ranges (such as coarse, mid, and fine).

In the embodiment of FIG. 6, a tap in the delay line 605 occurs following each fine delay element 611a-d, resulting in the C90, C180, C270, and C360 signals as shown. The phase detector 630 includes a first pulse generator 635 configured to generate an UP signal, in an analogous manner as described above with reference to FIGS. 3-5. The phase detector 630 further includes a second pulse generator 640 configured to generate a DN signal, in an analogous manner as described above with reference to FIGS. 3-5. The phase detector 630 further includes an optional reset signal generator 655 configured to generate a reset signal in an analogous manner as described above with reference to FIGS. 3-5. The UP and DN signals are used by a shift logic generator 660 to generate a control signal to adjust the delay of the delay line 605. A shift control 650 generates the digital signals for adjusting the delay of delay line 605, and it may include a first signal used to adjust a delay of the coarse delay elements and a second signal used to adjust a delay of the fine delay elements, as shown in FIG. 6.

Figure 7:
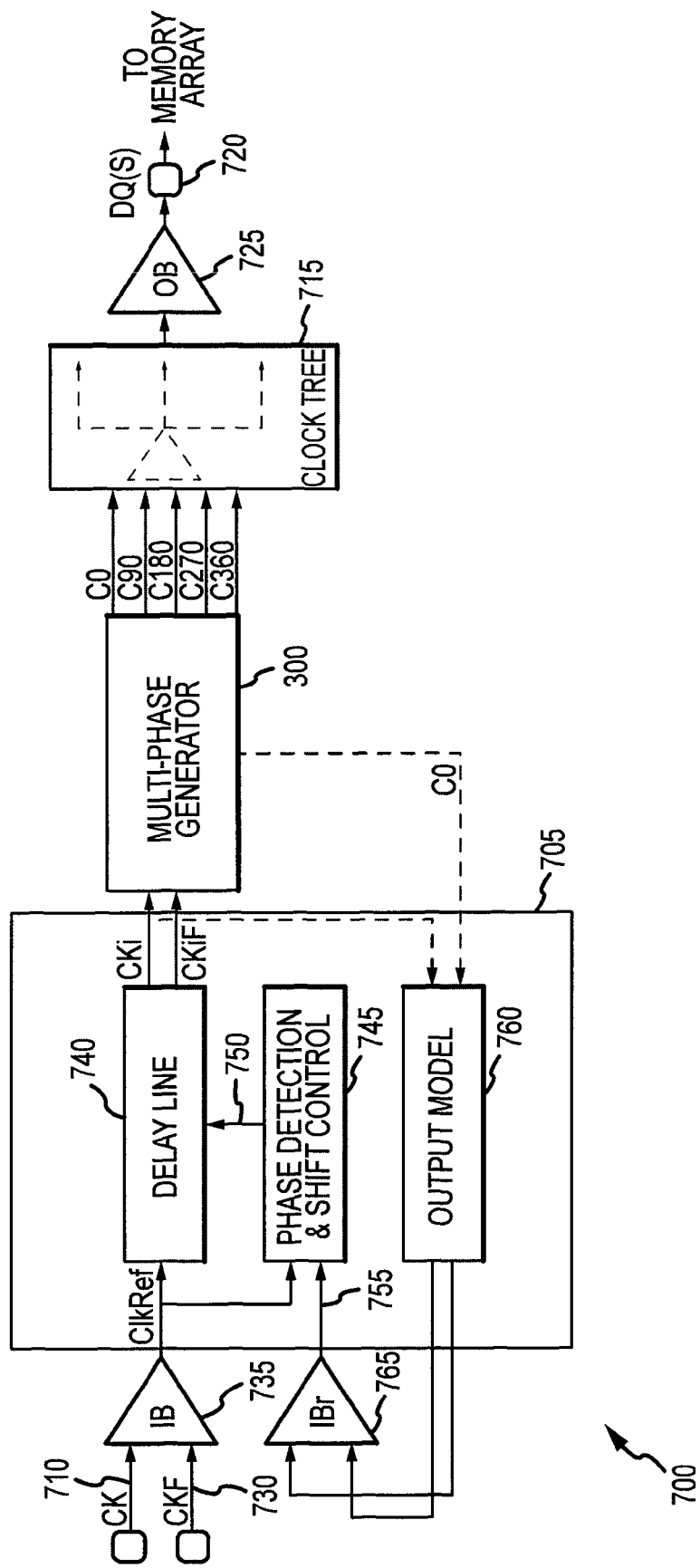
FIG. 7 is a schematic diagram of a portion of a memory device according to an embodiment of the present invention.

FIG. 7 depicts a portion of a memory device 700. The memory device receives a clock signal CK 710 and complementary clock signal CKF 730. The CK and CKF signals may be coupled to the memory device 700 by a memory controller, processor, or other electronic element. The multi-phase clock signal generator 300 of FIG. 3 is coupled to a delay locked loop 705 for use in locking the output signals of the multi-phase clock signal generator to the received clock signal CK 710. The received clock signal 710 and optional complementary signal 730 are coupled to an input buffer 735. For example, the input buffer 735 may receive the clock signals 710 and 730 from off-chip, or from another portion of a chip than the input buffer 735. The input buffer 735 couples the buffered ClkRef signal to the delay lock loop 705. The delay lock loop 705 includes a delay line 740 and a phase detection and shift control element 745. The delay line is configured and controlled by the phase detection and shift control element 745 to output a clock signal CKi, and optionally a complementary clock signal CKiF that are in phase with the ClkRef signal. The phase detection and shift control element 745 couples a control signal 750 to the delay line 740 to adjust the delay of the delay line 740 to minimize a phase difference between the ClkRef signal and a feedback signal 755. The feedback signal 755 may be based on either one of the signals generated by the multi-phase clock signal generator 300 (C0 as shown in FIG. 7), or the input signal CKi to the multi-phase clock signal generator 300, as indicated by the dashed lines in FIG. 7. In this manner, the multi-phase clock signal generator 300 may be either inside of the delay-locked loop 705 (when the signal C0 is used as the feedback signal) or outside of the delay locked loop 705 (when the CKi signal is used).

FIG. 7 also illustrates the output signals of the multi-phase clock signal generator 300 (the signals C0, C90, C180, C270, and C360) coupled to a clock tree 715 for distribution to the DQ(s) 720 of the memory device 700. In this manner, the clock signals generated by the multi-phase clock signal generator may be used to clock operation of the DQ(s) 720. Although distribution to a DQ 720 is shown in FIG. 7, the clock signal s from the multi-phase clock signal generator 300 may generally be coupled to any number of DQs. Further, output signals of the multi-phase clock signal generator 300 may additionally or instead be coupled to other elements of the memory device 700 or other electronic system employing the multi-phase clock signal generator 300. An output buffer 725 may be provided at each destination to couple one or more of the clock signals to the destination, such as DQ 720.

The feedback signal used by the phase detection and shift control element 745 may be coupled to one or more model delay elements, including the output model element 760 and the buffer delay element 765 shown in FIG. 7. The buffer delay element 765 models the delay of the input buffer 735. The output model delay element 760 models the delay of an output path between the point the feedback signal was generated, and the destination of the signal generated by the multi-phase clock signal generator 300 (the clock tree 715 and the output buffer 725 in the example of FIG. 7). By delaying the feedback signal by an amount equal to the delay of the output path, the delay locked-loop minimizes the phase difference between the output signal arriving at the DQ 720 and the input clock signal 710.

Figure 8:
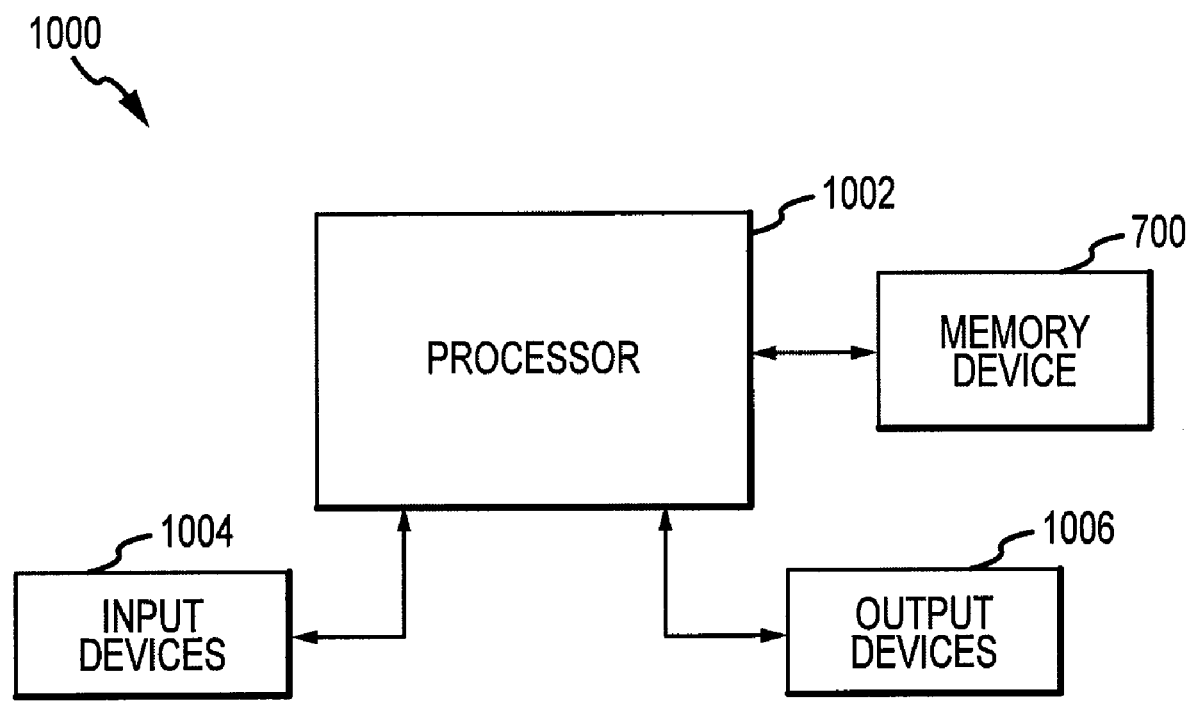
FIG. 8 is a schematic diagram of a processor-based system according to an embodiment of the present invention.

FIG. 8 is a block diagram of a processor-based system 1000 including processor 1002 that communicates with a memory device 700. The memory device 700 may be integral with or physically separate from the processor 1002 and communication between the two may take place in any manner. The memory device 700 may contain one or more multi-phase clock signal generators 300 to generate clock signals having various phases in accordance with embodiments of the invention described above. Typically, the processor 1002 is coupled through address, data, and control buses to the memory device 700 to provide for writing data to and reading data from one or more memory arrays in the memory device 700. The processor 1002 may include circuitry for performing various processing functions, such as executing specific software to perform specific calculations or tasks. In addition, the processor-based system 1000 includes one or more input devices 1004, such as a keyboard or a mouse, coupled to the processor 1002 to allow a user to interface with the processor-based system 1000. Typically, the processor-based system 1000 also includes one or more output devices 1006 coupled to the processor 1002, such as a printer or display. One or more data storage devices may also be coupled to the processor 1002 to store data or retrieve data from external storage media (not shown). Examples of such storage devices include hard and floppy disks, tape cassettes, compact disk read-only ("CD-ROMs") and compact disk read-write ("CD-RW") memories, and digital video disks ("DVDs").

The processor-based system 1000 shown in FIG. 8 may be implemented in any of a variety of products employing processors and memory including for example cameras, phones, wireless devices, displays, chip sets, set top boxes, gaming systems, vehicles, and appliances. Resulting devices employing the processor-based system 1000 may benefit from the embodiments of a multi-phase clock signal generator described above to perform their ultimate user function.

From the foregoing it will be appreciated that, although specific embodiments of the invention have been described herein for purposes of illustration, various modifications may be made without deviating from the spirit and scope of the invention. For example, although the generation of quadrature clock signals has been discussed and described, embodiments of the invention may generate substantially any number of clock signals having any phase relationship therebetween by, for example, adjusting a number of identical delay elements per tap in the delay line generating the clock signals. Further, although analog embodiments are shown and described above, other embodiments of the present invention may be implemented using one or more digital components.

What is claimed is:

1. A multi-phase periodic signal generator comprising:
a plurality of delay elements including a first delay element, an intermediate delay element, and a third delay element, each of the plurality of delay elements coupled such that an output of a respective delay element is coupled to an input of a next delay element, each of the respective delay elements configured to delay a signal applied to an input of the respective delay element and couple the delayed signal to the respective next delay element, the first delay element configured to receive a first periodic signal, the intermediate delay element configured to output an intermediate periodic signal, and the third delay element configured to output a third periodic signal;
a first pulse generator configured to receive the first and intermediate signals and generate a first pulse having a width corresponding to a time between a rising edge of the intermediate signal and a next rising edge of the first signal;
a second pulse generator configured to receive the intermediate and third signals and generate a second pulse having a width corresponding to a time between a rising edge of the intermediate signal and a next rising edge of the third signal; and
a control signal generator configured to receive the first and second pulses and generate a control signal to configure the delay of the plurality of delay elements such that the first, intermediate, and third signals have a particular phase relationship.

2. The multi-phase signal generator according to claim 1 wherein the first and second pulses are duty-cycle corrected clock signals.

3. The multi-phase signal generator according to claim 1 wherein the control signal generator comprises a charge pump.

4. The multi-phase signal generator according to claim 1 wherein the control signal generator comprises a shift logic generator.

5. The multi-phase signal generator according to claim 1 further comprising a reset pulse generator coupled to the first and second pulse generators, the reset pulse generator configured to receive an indication of the rising edge of the intermediate signal and the first to arrive of the next rising edge of the first signal and the next rising edge of the third signal, the reset pulse generator configured to truncate the first pulse when the next rising edge of the third signal arrives more than a threshold time before the next rising edge of the first signal and to truncate the second pulse when the next rising edge of the first signal arrives more than the threshold time before the next rising edge of the third signal.

6. The multi-phase signal generator according to claim 5 wherein the reset pulse generator is coupled to receive the first, intermediate, and third signals and the indication of the rising edge of the intermediate signal comprises receipt of the rising edge of the intermediate signal.

7. The multi-phase signal generator according to claim 6 wherein the reset pulse generator is configured to generate a reset pulse a delay time after receipt of the first to arrive of the next rising edge of the first signal and the next rising edge of the third signal.

8. The multi-phase signal generator according to claim 7 wherein the first and intermediate pulse generators are each configured to truncate the first and second pulses, respectively, responsive to receipt of the reset pulse.

9. The multi-phase signal generator according to claim 5 wherein the reset pulse generator is coupled to receive the first and second pulses and the indication of the rising edge of the intermediate signal and the first to arrive of the next rising edge of the first signal and the next rising edge of the third signal comprises receipt of one of the first and second pulses.

10. The multi-phase signal generator according to claim 9 wherein the reset pulse generator is configured to generate a reset pulse a delay time after receipt of the first received falling edge of the first or second pulses.

11. The multi-phase signal generator according to claim 1 wherein the control signal generator is configured to receive the first and second pulses and generate a control signal to adjust a delay of each of the plurality of delay elements to minimize the phase difference between the first and third signals.

12. The multi-phase signal generator according to claim 1 wherein each of the plurality of delay elements includes a control terminal, each of the respective plurality of delay elements is configured to delay the signal applied to its respective input terminal an amount determined by a signal applied to its respective control input, the multi-phase signal generator further comprising:
a bias generator configured to receive the control signal and couple a bias signal to the control inputs of the plurality of delay elements, the bias signal configured to adjust the delay of the delay elements to minimize the difference between the first and second pulses.

13. The multi-phase signal generator according to claim 12 wherein the plurality of delay elements includes a first plurality of delay elements configured to provide coarse control of signal delay and a second plurality of delay elements configured to provide fine control of signal delay, the bias generator configured to couple a first bias signal to the first plurality of delay elements and a second bias signal to the second plurality of delay elements.

14. The multi-phase signal generator according to claim 1 wherein the intermediate signal has a 180 degree phase difference from the first signal and the third signal has a 360 degree phase difference from the first signal.

15. The multi-phase signal generator according to claim 14 wherein one of the plurality of delay elements is configured to output a signal having a 90 degree phase difference from the first signal and another one of the plurality of delay elements is configured to output a signal having a 270 degree phase difference from the first signal.

16. The multi-phase signal generator according to claim 15 wherein the plurality of delay elements includes a first group of delay elements including the first delay element, the delay elements of the first group coupled in series and configured to output the signal having a 90 degree phase difference from the first signal and wherein the plurality of delay elements includes a second group of delay elements, the delay elements of the second group coupled in series and configured to receive the signal having a 90 degree phase difference from the first signal and output the intermediate signal having a 180 degree phase difference from the first signal, and wherein the plurality of delay elements further includes a third group of delay elements, the delay elements of the third group coupled in series and configured to output the signal having a 270 degree phase difference from the first signal, and wherein the plurality of delay elements further includes a fourth group of delay elements including the third/last element, the delay elements of the fourth group coupled in series and configured to receive the signal having a 270 degree phase difference from the first signal and output the third signal having a 360 degree phase difference from the first signal, and wherein the first, second, third and fourth groups of delay elements are configured to provide substantially a same amount of delay responsive to a control signal received from the bias generator.

17. A memory device comprising:
an input buffer configured to receive an input signal;
a multi-phase signal generator coupled to the input buffer, the multi-phase signal generator comprising:
a plurality of delay elements including a first delay element, an intermediate delay element, and a third delay element, each of the plurality of delay elements coupled such that an output of a respective delay element is coupled to an input of a next delay element, each of the respective delay elements configured to delay a signal applied to an input of the respective delay element and couple the delayed signal to the respective next delay element, the first delay element configured to receive the first signal, the intermediate delay element configured to output an intermediate signal, and the third delay element configured to output a third signal;
a first pulse generator configured to receive the first and intermediate signals and generate a first pulse having a width corresponding to a time between a rising edge of the intermediate signal and a next rising edge of the first signal;
a second pulse generator configured to receive the intermediate and third signals and generate a second pulse having a width corresponding to a time between a rising edge of the intermediate signal and a next rising edge of the third signal; and
a control signal generator configured to receive the first and second pulses and generate a control signal to configure the delay of the plurality of delay elements such that the first, intermediate, and third signals have a particular phase relationship; and
an array of memory cells, the array of memory cells coupled to receive the intermediate and third signals.

18. The memory device of claim 17 further comprising:
a delay locked loop configured to receive the input signal and output the first signal, the delay locked loop configured to generate the first signal by delaying the input signal by a delay amount, the delay locked loop further configured to receive a feedback signal and adjust a delay of the delay line such that the first signal input to the multi-phase signal generator is in phase with a signal received by the array of memory cells.

19. The memory device of claim 18 wherein the feedback signal comprises the first signal coupled through an output model delay element having a delay amount substantially equal to an amount of delay between the input of the multi-phase signal generator and the array of memory cells.

20. The memory device of claim 18 wherein the feedback signal comprises the first signal output from the multi-phase signal generator coupled through an output model delay element having a delay amount substantially equal to an amount of delay between the output of the multi-phase signal generator and the array of memory cells.

21. A method for generating a plurality of periodic signals including a first signal, an intermediate signal having a first phase relationship with the first signal, and final signal having a second phase relationship with the first signal, the method comprising:
delaying the first signal a first delay amount to generate the intermediate signal;
delaying the intermediate signal a second delay amount to generate the final signal;
generating a first pulse having a width corresponding to a time between a rising edge of the intermediate signal and a next rising edge of the first signal;
generating a second pulse having a width corresponding to a time between a rising edge of the intermediate signal and a next rising edge of the third signal; and
configuring the first and second delay amounts based on the first and second pulses.

22. The method according to claim 21 further comprising:
using the first and second pulses as duty-cycle corrected clock signals.

23. The method according to claim 21 further comprising:
truncating the first pulse when the next rising edge of the third signal occurs more than a threshold time before the next rising edge of the first signal.

24. The method according to claim 21 further comprising:
truncating the second pulse when the next rising edge of the first signal occurs more than a threshold time before the next rising edge of the third signal.

25. The method according to claim 21 further comprising:
generating a reset pulse responsive to receipt of the first of the next rising edge of the first signal and the next rising edge of the third signal.

26. The method according to claim 25 further comprising:
truncating the first or second pulse responsive to generation of the reset pulse.

27. The method according to claim 21 wherein the act of configuring the first and second delay amounts comprises adjusting the first and second delay amounts to minimize a difference between the respective widths of the first and second pulses.

28. The method according to claim 21 wherein the act of configuring the first and second delay amounts comprises generating a course control signal and a fine control signal.

29. The method according to claim 21 wherein the first phase relationship comprises 180 degrees and the second phase relationship comprises 360 degrees.

* * * * *